US009258929B2

(12) United States Patent
Zhang et al.

(10) Patent No.: US 9,258,929 B2
(45) Date of Patent: Feb. 9, 2016

(54) SERVER AND HEAT DISSIPATING ASSEMBLY THEREOF

(71) Applicants: Inventec (Pudong) Technology Corporation, Shanghai (CN); INVENTEC CORPORATION, Taipei (TW)

(72) Inventors: Jin Zhang, Shanghai (CN); Liming Zhao, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 274 days.

(21) Appl. No.: 14/030,701

(22) Filed: Sep. 18, 2013

(65) Prior Publication Data
US 2015/0043148 A1 Feb. 12, 2015

(30) Foreign Application Priority Data

Aug. 12, 2013 (CN) .......................... 2013 1 0349963

(51) Int. Cl.
*H05K 7/20* (2006.01)
(52) U.S. Cl.
CPC .................................. *H05K 7/20727* (2013.01)
(58) Field of Classification Search
CPC ............... H01L 2224/4824; H01L 2924/1434; G06F 1/20; G06F 1/206; G06F 13/4027; G06F 1/1656; G06F 1/203; G06F 9/5094; G06F 11/0721; G06F 1/16; G06F 2200/201; F28D 15/00; H05K 7/20; H05K 7/20145; H05K 7/2039; H05K 5/0217; H05K 7/20281; H05K 7/20381; H05K 7/20663; H05K 7/20736; H05K 7/20763; H05K 7/20781; H05K 7/20836; H05K 9/0007; Y02B 60/1275; F28F 13/00

USPC ............... 700/300; 165/104.28, 80.2, 96; 361/679.48, 679.31, 679.32, 679.49, 361/679.55, 690, 697
See application file for complete search history.

(56) References Cited

U.S. PATENT DOCUMENTS 7,343,962 B2 * 3/2008 Xia et al. ..................... 165/80.3
7,881,060 B2 * 2/2011 Chung et al. ................. 361/700
(Continued)

FOREIGN PATENT DOCUMENTS

| CN | 101616565 A | 12/2009 |
| TW | M325536 | 1/2008 |
| TW | M427769 | 4/2012 |

OTHER PUBLICATIONS

Intellectual Property Office, Ministry of Economic Affairs, R. O. C, "Office Action", Aug. 24, 2015, Taiwan.

*Primary Examiner* — Hung S Bui
*Assistant Examiner* — Michael Matey
(74) *Attorney, Agent, or Firm* — Locke Lord LLP; Tim Tingkang Xia, Esq.

(57) ABSTRACT

A server and a heat dissipating assembly thereof includes an airflow generating device, a central processing unit, several memory slots, a first cooling fin set, a second cooling fin set and a heat conductive member. The airflow generating device generates an airflow flowing along an airflow direction and is located at a front side of the central processing unit. The several memory slots are used to plug of memories, and they are located at a lateral side of a central processing unit. The first cooling fin set is correspondingly located over the central processing unit and at a lateral side of the memory slots. The second cooling fin set is located at a front side of the memory slots and between the airflow generating device and the memory slots. The first cooling fin set is thermally connected with the second cooling fin set via the heat conductive member.

18 Claims, 3 Drawing Sheets

(56) References Cited

U.S. PATENT DOCUMENTS

| | | | |
|---|---|---|---|
| 8,069,909 B2* | 12/2011 | Qin et al. | 165/104.33 |
| 8,381,801 B2* | 2/2013 | Zhou et al. | 165/104.26 |
| 8,564,951 B1* | 10/2013 | Watanabe et al. | 361/695 |
| 2006/0259793 A1* | 11/2006 | Moore et al. | 713/300 |
| 2008/0113607 A1* | 5/2008 | Shih | 454/233 |
| 2008/0310122 A1* | 12/2008 | Chou et al. | 361/720 |
| 2009/0122480 A1* | 5/2009 | Chou et al. | 361/679.52 |
| 2009/0242186 A1* | 10/2009 | Koshiyama | 165/288 |
| 2010/0175851 A1* | 7/2010 | Heydari et al. | 165/80.2 |
| 2010/0206522 A1 | 8/2010 | Zhou et al. | |
| 2010/0265653 A1* | 10/2010 | Neumann | 361/679.47 |
| 2013/0102237 A1* | 4/2013 | Zhou et al. | 454/184 |
| 2013/0155622 A1* | 6/2013 | Chang et al. | 361/720 |
| 2013/0301214 A1* | 11/2013 | Bohm et al. | 361/679.54 |
| 2014/0071624 A1* | 3/2014 | Aoki et al. | 361/699 |
| 2014/0085808 A1* | 3/2014 | Tung et al. | 361/679.47 |
| 2014/0118920 A1* | 5/2014 | Ng et al. | 361/679.33 |
| 2015/0043160 A1* | 2/2015 | Tunks et al. | 361/679.52 |

* cited by examiner

SERVER AND HEAT DISSIPATING ASSEMBLY THEREOF

CROSS-REFERENCE TO RELATED APPLICATIONS

This non-provisional application claims priority under 35 U.S.C. §119(a) on Patent Application No(s).201310349963.8 filed in China. on Aug. 12, 2013, the entire contents of which are hereby incorporated by reference.

TECHNICAL FIELD

The disclosure relates to a server, more particularly to a server having a heat dissipating assembly.

BACKGROUND

In general, the electrical device comprises a variety of different kinds of electrical components, some of which can be removed from the electronic device depending on what is actually being required. In other words, some of the electrical components are detachably disposed in the electronic device. The heat dissipation component is designed for when the electrical device has been fully loaded with electrical components, which is called a "fully-loaded state". In general, when the electrical device is in use, there are still some spaces left in the electrical device in order to accommodate other electrical components in the future. In addition, the heat dissipation component operates to produce an airflow flowing inside the electronic device to generate a flow field. However, the flow field in the "full-loaded state" is different from the flow field when the electronic device is not fully loaded with electrical components. Accordingly, the heat dissipation which is applied to the "fully-loaded state" may not provide the same heat dissipation for the electronic device when it is not fully loaded.

For example, a fan generates an airflow flowing toward a cooling fin set that is located over a central processing unit and toward the multiple memory slots that are fully loaded with multiple memories, namely, the airflow may flow through the cooling fin set and the memory slots uniformly. However, when the memory slots are not fully loaded, that is, some of the slots are not connected with the memories, a part of the airflow, which flows to the cooling fin set when the memory slots are fully loaded, flows to the memory slots instead of flowing to the cooling fin set, because the wind resistance at the memory slots is decreased. Nevertheless, the heat generated by the central processing unit is usually greater than the heat generated by the memory module, and the maximum allowable temperature (the maximum temperature at which the component can operate normally) of the central processing unit is lower than that of the memory module. When the server operates, even if the actual temperature of the central processing unit substantially approaches its allowable temperature, the actual temperature of the memory module is still much lower than its allowable temperature. Therefore, if increase airflow to the cooling fin but decrease airflow to memory slots and some of the heat generated by the central processing unit is transferred to the memory module, it not only keeps the memory module operating normally, but also decreases the temperature of the central processing unit. On the other hand, when not a lot of airflow is flowing through the cooling fin set or dissipating the heat of the central processing unit, the central processing unit may not operate normally because the actual temperature of the central processing unit is higher than the allowable temperature.

People in the industry dispose the virtual memory module on the memory slot, which cannot work but has the same shape as the real one. Accordingly, the flow field inside the electrical device corresponds to the original flow field when the electronic device is fully loaded with the electronic components and the wind resistance at the memory slots keeps same as that when memory slots are fully loaded. However, it increases the cost and the virtual memory module may be removed after the additional memory module has been disposed.

SUMMARY

An embodiment of the disclosure provides a server and a heat dissipating assembly thereof comprising an airflow generating device, a central processing unit, several memory slots, a first cooling fin set, a second cooling fin set and a heat conductive member. The airflow generating device generates an airflow flowing along an airflow direction and is located at a front side of the central processing unit. The several memory slots are used to plug of memories, and the memory slots are located at a lateral side of a central processing unit. The first cooling fin set is correspondingly located over the central processing unit and at a lateral side of the memory slots. The second cooling fin set is located at a front side of the memory slots and between the airflow generating device and the memory slots. The first cooling fin set is thermally connected with the second cooling fin set via the heat conductive member. A part of heat generated by the central processing unit is transferred to the second cooling fin set via the heat conductive member and a part of the airflow passes through the second cooling fin set for taking the part of the heat away and further flows to the memory slots.

BRIEF DESCRIPTION OF THE DRAWINGS

The present disclosure will become more fully understood from the detailed description given herein below along with the accompanying drawings which are for illustration only, thus are not limitative of the present disclosure, and wherein.

DETAILED DESCRIPTION

Figure 1:
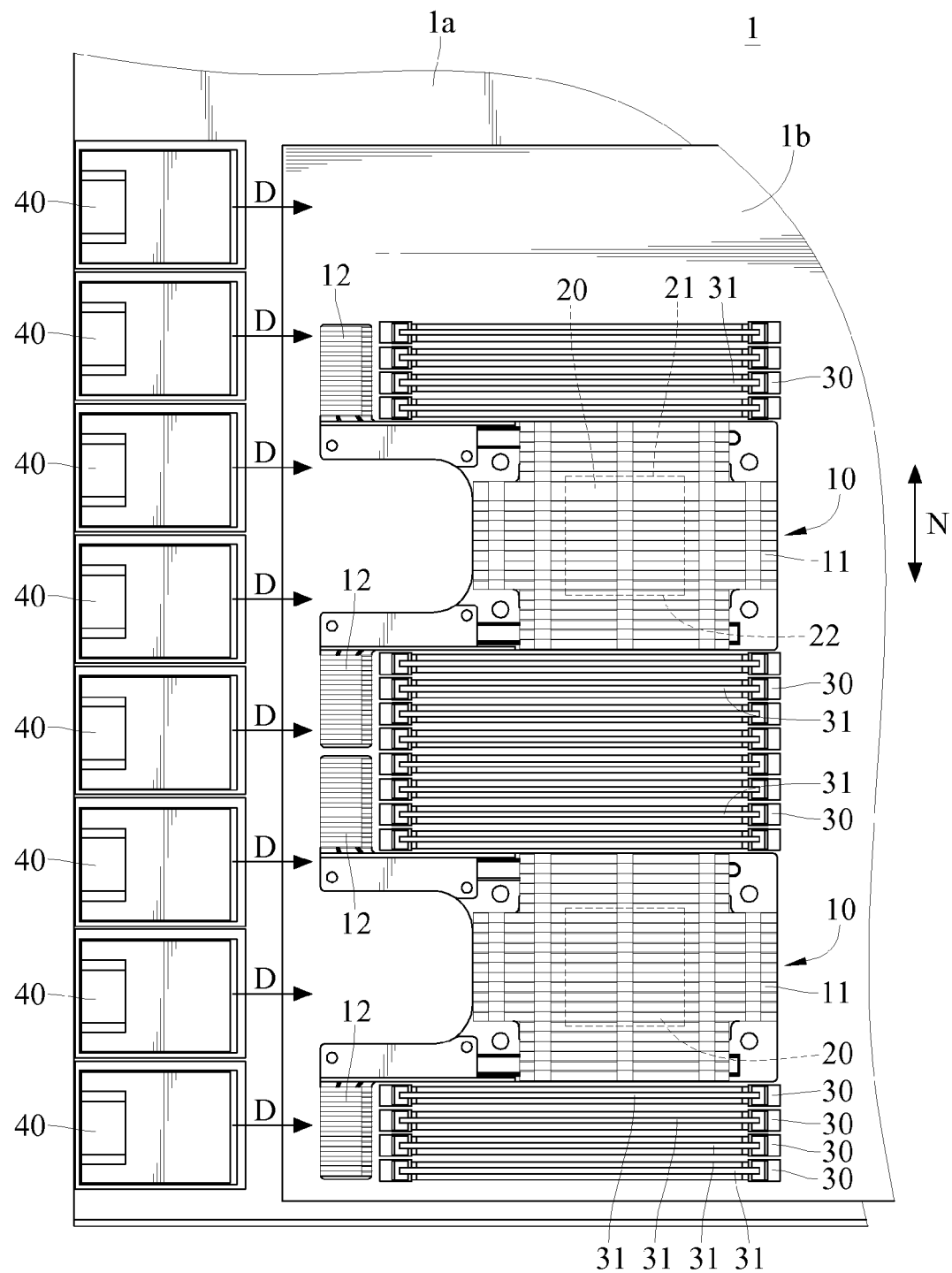
FIG. 1 is a top view of a server according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Please refer to FIG. 1, which is a top view of a server 1 according to an embodiment of the disclosure. In this embodiment, the server comprises a shell 1*a*, a motherboard 1*b*, an airflow generating device, a plurality of central processing units 20, a plurality of memory slots 30 and a plurality of heat dissipating assemblies 10. The airflow generating device is a row of fans 40, but the disclosure is not limited thereto.

The airflow generating device and the motherboard 1*b* are located inside the shell 1*a*. The airflow generating device is used to generate airflow to flow along an airflow direction D. The airflow generating device is located at a front side the central processing unit 20. The motherboard 1*b* is located adjacent to the airflow generating device for receiving the airflow from the airflow direction D. The central processing unit 20 is located on the motherboard 1*b* and is located adjacent to the airflow generating device 40 for receiving the airflow from the airflow direction D. The memory slot 30 is located on the motherboard 1*b* and is located adjacent to the airflow generating device 40 for receiving the airflow from the airflow direction D. The memory slots 30 each are used for plugging of a memory 31. The memory slot 30 is located on one of two lateral sides 21, 22 of a central processing unit 20. In other words, in this embodiment, the memory slots 30 and the central processing units 20 are located alternately on the motherboard 1*b* side by side. A point located on the one 21 of the two lateral sides and another point located on the other lateral sides 22. The two points are accordingly opposite to each other and form a lateral direction N based on the central processing unit 20, and the lateral direction N is substantially perpendicular to the airflow direction D. The heat dissipating assembly 10 is located on the motherboard 1*b*, and is thermally connected with the central processing unit 20 in order to dissipate the heat generated by the central processing unit 20.

Figure 2:
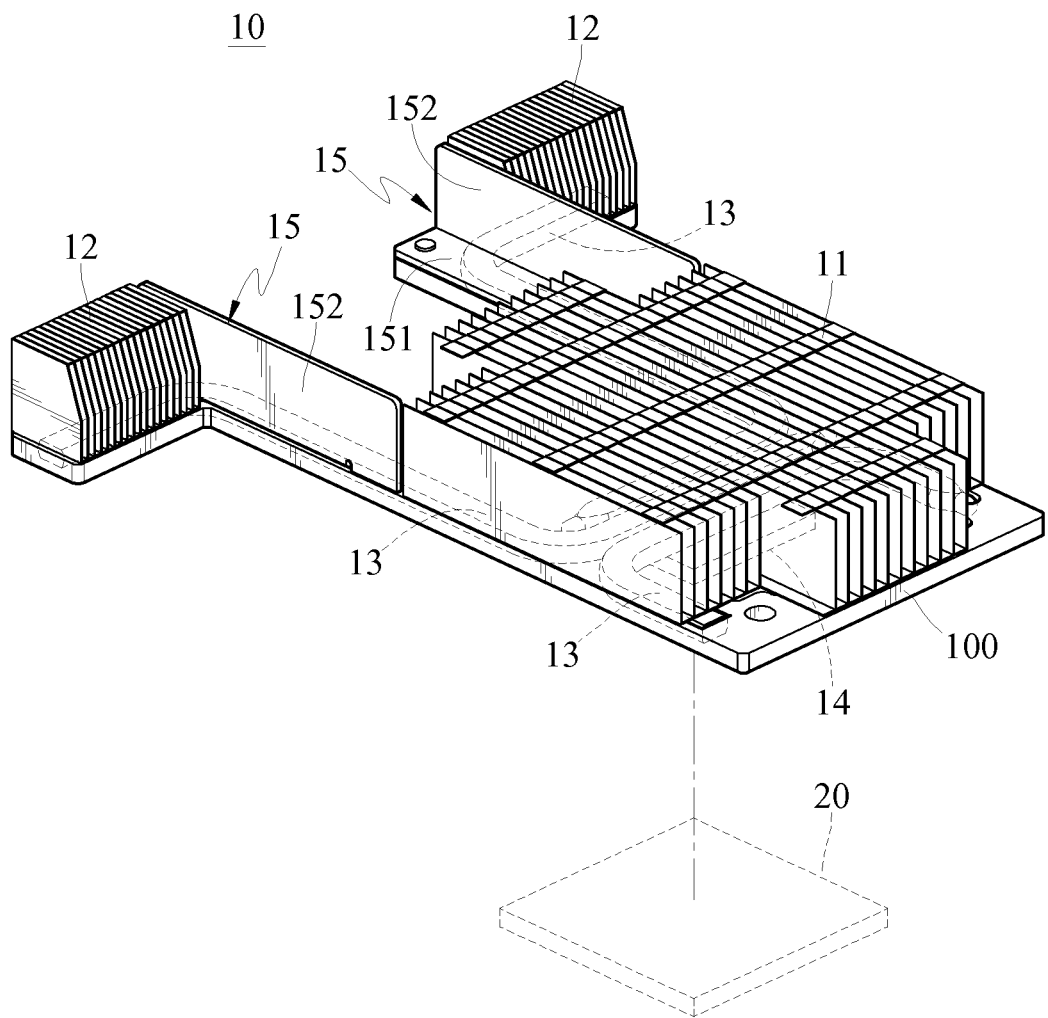
FIG. 2 is a perspective view of a heat dissipating assembly described in FIG. 1.
Figure 3:
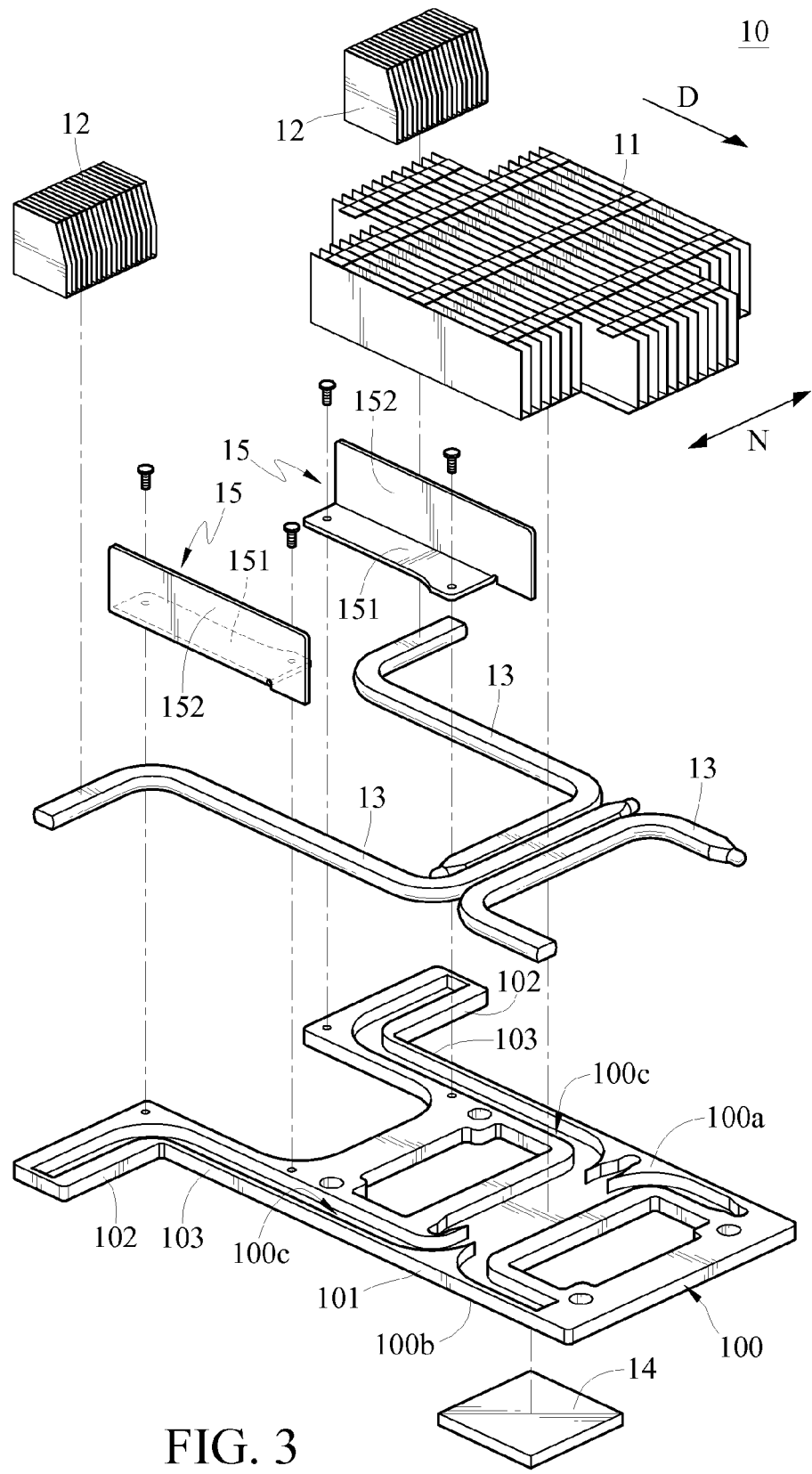
FIG. 3 is an exploded view of the heat dissipating assembly described in FIG. 2.

Please refer to FIG. 2 and FIG. 3, FIG. 2 is a perspective view of a heat dissipating assembly described in FIG. 1, and FIG. 3 is an exploded view of the heat dissipating assembly described in FIG. 2. The heat dissipating assembly 10 comprises a metal base 100, a first cooling fin set 11, a second cooling fin set 12, a plurality of heat conductive members 13, a copper plate 14 and a pair of flow guiding member 15. The first cooling fin set 11 keeps a distance from the second cooling fin set 12.

The metal base 100 of the heat dissipating assembly 10 can be made from steel or stainless steel. The metal base 100 is securely located on the motherboard 1*b* and the metal base 100 is integrally formed. The metal base 100 includes a first surface 100*a*, a second surface 100*b*, a pair of extending grooves 100*c*, a main portion 101, a pair of extension sections 102 and a pair of connecting sections 103. The first surface 100*a* and the second surface 100*b* are opposite to each other. The main portion 101 is connected with the extension section 102 via the connecting section 103. The connecting section 103 extends from the main portion 101 to the extension section 102 as well as extending inversely to the airflow direction D. The extension section 102 extends from the connecting section 103 toward the lateral direction N of the central processing unit 20. Thus, the extension of the extension section 102 is substantially perpendicular to the connecting section 103 and the airflow direction D. The extending groove 100*c* is formed in the main portion 101, the extension section 102 and the connecting section 103 and passes through the connecting section 103. There is no heat source located between the extension section 102 and the motherboard 1*b* illustrated in FIG. 1. In some other embodiments, the metal base 100 includes only one extension section 102 and only one connecting section 103, or includes more than two extension sections 102 and more than two connecting sections 103.

The heat conductive member 13 can be a heat pipe, or even can be a copper heat pipe. The heat conductive member 13 is securely located in the extending groove 100*c*. The first cooling fin set 11 and the second cooling fin set 12 can be made of aluminum or copper. The first cooling fin set 11, illustrated in FIG. 1, is correspondingly located over the central processing unit 20. The first cooling fin set 11 is securely located on the main portion 101 of the metal base 100 and is located on the first surface 100*a* of the metal base 100. The second cooling fin set 12, illustrated in FIG. 2, is located between the airflow generating device 40 and the memory slots 30. The second cooling fin set 12 is securely located on the extension section 102 of the metal base 100 and is located on the first surface 100*a* of the metal base 100. Both the first cooling fin set 11 and the second fin set 12 comprise a plurality of fins, the distance between the fins of the first cooling fin set 11 is greater than the distance between the fins of the second cooling fin set 12, so that the wind resistance of the second fin set 12 is relatively increased. In other words, the fins of the second cooling fin set 12 are much more tightly arranged than that of the fins of the first cooling fin set 11. The first cooling fin set 11 is thermally connected with the second cooling fin set 12 via the two heat conductive member 13. The second surface 100*b* of the metal base 100 faces toward the central processing unit 20. The main portion 101 is located between the first cooling fin set 11 and the central processing unit 20. The extending groove 100*c* is formed between the first surface 100*a* and the second surface 100*b*.

The copper plate 14 is located in the main portion 101 and is located between the central processing unit 20 and the heat conductive member 13. The copper plate 14 is thermally connected to and is located between the central processing unit 20 and the heat conductive member 13. In this embodiment, there is no copper plate 14 located in the extension section 102 for heat transmission.

The flow guiding member 15 comprises a mounting plate 151 and a flow guiding plate 152. The mounting plate 151 is securely located on the connecting section 103 of the metal base 100 and covers some portion of the heat conductive member 13. The mounting plate 151 is parallel to motherboard 1*b* and is located between the first cooling fin set 11 and the second cooling fin set 12. The flow guiding plate 152 is perpendicular to the motherboard 1*b* and extends along the airflow direction D for preventing the airflow from passing between the second cooling fin set 12 and the first cooling fin set 11.

The heat generated by the central processing unit 20 is transferred to the heat conductive member 13 via the copper plate 14. The heat conductive member 13 transfers the heat to both the first cooling fin set 11 and the second cooling fin set 12. The airflow generating device 40 generates the airflow to flow along the airflow direction D from the airflow generating device 40. When the airflow passes through the heat dissipating assembly 10, some portion of the airflow passed through the second cooling fin set 12 dissipates the heat transferred to the second cooling fin set 12, and then flows to the memory slots 30. Some other portion of airflow flows to the first cooling fin set 11 in order to dissipate the heat transferred to the first cooling fin set 11.

The amount of the airflow passing through the first cooling fin set 11 is more than the airflow passing through the second cooling fin set 12. Moreover, the airflow passing between the two second cooling fin sets 12 is guided by the flow guiding plate 152, so the airflow may directly flow toward the first cooling fin set 11. The flow guiding plate 152 prevents the airflow passing between the first cooling fin set 11 and the second cooling fin set 12. Therefore, whether the memory 31 is plugged to the memory slot 30, the heat dissipating assembly 10 solves the problem that the airflow only passes through the memory slot 30 but rarely passes through the first cooling fin set 11, which leads to dissipating the heat generated by the central processing unit 20 efficiently.

Table 1 and Table 2 are experimental results between the server illustrated in FIG. 1 and the server in the prior art. The server in the prior art does not have the second cooling fin set 12. In this experiment illustrated in Table 1, the ambient temperature is 35 degrees Celsius (° C.) and the power of the central processing unit 20 is 145 watts. When the memories 31 are all located to the memory slots 30, the two temperatures of the central processing units 20 in the prior art are 82.6° C. and 83.4° C., respectively. Those temperatures are higher than the allowable temperature of 77.8° C., which easily causes the central processing unit 20 to fail. In this embodiment, one of the central processing unit temperatures is 65.2° C. and the other one is 69.6° C., which are lower than the allowable temperature of 77.8° C. The average temperature of the memory module in the upper section is 68.1° C. and the average temperature in the lower section is 68.6° C., which are all lower than the allowable temperature of 85° C. Therefore, the server 1 in this embodiment keeps a normal operation.

TABLE 1

| Component Type | Allowable Temperature (° C.) | Temperature in prior art (° C.) | Temperature in this embodiment (° C.) |
|---|---|---|---|
| Central Processing Unit (Upper Section) | 77.8 | 82.6 | 65.2 |
| Central Processing Unit (Upper Section) | 77.8 | 83.4 | 69.6 |
| Memory Module (Upper Section in Average) | 85 | 63.9 | 68.1 |
| Memory Module (Lower Section in Average) | 85 | 64.1 | 68.6 |

In this experiment illustrated in Table 2, the power of the central processing unit is 145 watts, the loading ratio (the ratio of current state to fully-loaded state) is 66% and the airflow generating device is fans 40. The Table 2 is to describe the comparison of the rotation speed and the power consumption between the server in this embodiment and the one in the prior art. When the ambient temperature is 35° C., the rotational speed of the airflow generating device in the prior art is 100% and the power consumption is 72 watts. However, in this embodiment, the rotational speed of the airflow generating device 40 is only 50% and the power consumption is only 14.8 watts. When the ambient temperature is 25° C., the rotational speed of the airflow generating device in the prior art is 60% and the power consumption of the airflow generating device is 22 watts. However, in this embodiment, the rotational speed of the airflow generating device 40 is only 36% and the power consumption of the airflow generating is only 9.4 watts. Therefore, under the circumstances that when the central processing unit 20 consumes fewer electricity energy, the heat dissipating assembly 10 may still dissipates the heat generated by the central processing unit 20.

TABLE 2

| Airflow | 35 (° C.) | | 25(° C.) | |
|---|---|---|---|---|
| Generating Device | Prior Art | This Embodiment | Prior Art | This Embodiment |
| Rotational Speed (%) | 100 | 50 | 60 | 36 |
| Power (Watt) | 72 | 14.8 | 22 | 9.4 |

According to the server and the heat dissipating assembly thereof, the first cooling fin set dissipates a part of the heat generated by the central processing unit, and another part of the heat generated by the central processing unit is transferred to the second cooling fin set by the heat conductive member for further dissipation. Because the second cooling fin set is located between the airflow generating device and the memory slot, a part of the airflow passing through the second cooling fin set takes the said another part of the heat away and further flows to the memory slots. Therefore, some portion of the heat is transferred to the memory slots by the part of airflow which passes through the second cooling fin set. Moreover, there is a great difference between the actual temperature and the allowable temperature of the memory module. Thus, although the heat makes the temperature of the memory increase, the heat makes no effect on the normal operation of the memory but still decreases the temperature of the central processing unit (the main heat source) effectively. Furthermore, the second cooling fin set is located between the airflow generating device and the memory slots, and the distance between the fins of the second cooling fin set is smaller than the distance between the fins of the first cooling fin set. Accordingly, the wind resistance between the airflow generating device and the memory slots is increased, such that more airflow will be transferred to the first cooling fin set and the airflow can make better heat dissipating for the central processing unit, and there is no need to dispose virtual memory module for the unloaded memory slot. A portion of the airflow passed through the second cooling fin sets to the memory slots and a portion of the airflow directly flows to the first cooling fin set, and the flow guiding member prevents the airflow passing between the first cooling fin set and the second cooling fin set. Therefore, the heat dissipating assembly solves the problem where the airflow passes through the memory slots too much and passes through the first cooling fin set too little, and a part of the heat generated by the central processing unit is passed to the memory slots and the memory/memories plugged to the memory slots. In terms of the detailed, a part of the heat generated by the central processing unit is passed to the second cooling fin set via the heat conductive member, and further to the memory slots and the memory/memories plugged to the memory slots through the part of the airflow flowing through the second cooling fin set. Therefore, the heat dissipating assembly may efficiently dissipate the heat generated by the central processing unit.

What is claimed is:
1. A server, comprising:
an airflow generating device for generating airflow to flow along an airflow direction;
a central processing unit;
several memory slots each used for plugging of a memory, wherein the airflow generating device is located at a front side of the central processing unit and the memory slots are located at a lateral side of the central processing unit; and
a heat dissipating assembly, comprising:
a first cooling fin set correspondingly located over the central processing unit and at a lateral side of the memory slots;
a second cooling fin set located at a front side of the memory slots and between the airflow generating device and the memory slots;
a heat conductive member, wherein the first cooling fin set is thermally connected with the second cooling fin set via the heat conductive member; and
a flow guiding member located between the first cooling fin set and the second cooling fin set for preventing the airflow passing between the second cooling fin set and the first cooling fin set, wherein a part of heat generated by the central processing unit is transferred to the second cooling fin set via the heat conductive member and a part of the airflow passes through the second cooling fin set for taking the part of the heat away and further flows to the memory slots.

2. The server according to claim 1, wherein the heat dissipating assembly further comprises a metal base which is integrally formed, the first cooling fin set and the second cooling fin set are securely located on the metal base.

3. The server according to claim 2, wherein the metal base includes an extending groove, a main portion and an extension section, wherein the first cooling fin set is located on the main portion, and the second cooling fin set is located on the extension section, wherein the main portion is located between the first cooling fin set and the central processing unit, the extending groove extends from the main portion to the extension section, and the heat conductive member is securely located in the extending groove.

4. The server according to claim 3, wherein the metal base further comprises a connecting section, wherein the main portion is connected with the extension section via the connecting section, the extending groove is formed in the main portion, the extension section and the connecting section and passes through the connecting section.

5. The server according to claim 4, wherein the connecting section extends from the main portion to the extension section along a direction reverse to the airflow direction, and the extension section extends from the connecting section along a direction perpendicular to the airflow direction.

6. The server according to claim 4, further comprising a motherboard, wherein the central processing unit is located on the motherboard, the metal base is securely located on the motherboard, the heat dissipating assembly further comprises a copper plate located in the main portion, wherein the copper plate is thermally connected to and located between the central processing unit and the heat conductive member.

7. The server according to claim 3, wherein the metal base includes a first surface and a second surface which are opposite to each other, the first cooling fin set and the second cooling fin set are located on the first surface of the metal base, the second surface of the metal base faces toward the central processing unit, the first surface and the second surface form the extending groove therebetween.

8. The server according to claim 1, wherein the heat conductive member is a heat pipe.

9. The server according to claim 1, wherein both the first cooling fin set and the second fin set comprise a plurality of fins, the distance between the fins of the first cooling fin set is greater than the distance between the fins of the second cooling fin set.

10. A heat dissipating assembly, comprising:
a first cooling fin set;
a second cooling fin set;
a heat conductive member, wherein the first cooling fin set is thermally connected with the second cooling fin set via the heat conductive member; and
a flow guiding member, wherein the flow guiding member is located between the first cooling fin set and the second cooling fin set for preventing the airflow passing between the second cooling fin set and the first cooling fin set.

11. The heat dissipating assembly according to claim 10, wherein the heat dissipating assembly further comprises a metal base which is integrally formed, the first cooling fin set and the second cooling fin set are securely located on the metal base.

12. The heat dissipating assembly according to claim 11, wherein the metal base includes an extending groove, a main portion and an extension section, wherein the first cooling fin set is located on the main portion, and the second cooling fin set is located on the extension section, wherein the extending groove extends from the main portion to the extension section, and the heat conductive member is securely located in the extending groove.

13. The heat dissipating assembly according to claim 12, wherein the metal base further comprises a connecting section, the main portion is connected with the extension section via the connecting section, the extending groove is formed in the main portion, the extension section and the connecting section and passes through the connecting section.

14. The heat dissipating assembly according to claim 13, wherein the extensive direction is perpendicular to the connecting section.

15. The heat dissipating assembly according to claim 12, further comprising a copper plate, wherein the copper plate is located in the main portion and the copper plate is thermally connected to the heat conductive member.

16. The heat dissipating assembly according to claim 12, wherein the metal base includes a first surface and a second surface which are opposite to each other, the first cooling fin set and the second cooling fin set are located on the first surface of the metal base, and the first surface and the second surface form the extending groove therebetween.

17. The heat dissipating assembly according to claim 10, wherein the heat conductive member is a heat pipe.

18. The heat dissipating assembly according to claim 10, wherein both the first cooling fin set and the second fin set comprise a plurality of fins, the distance between the fins of the first cooling fin set is greater than the distance between the fins of the second cooling fin set.

* * * * *